(12) United States Patent
Kim

(10) Patent No.: US 8,629,696 B2
(45) Date of Patent: Jan. 14, 2014

(54) SEMICONDUCTOR DEVICE AND LEVEL SHIFTING CIRCUIT FOR THE SAME

(75) Inventor: Sung-Ho Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 21 days.

(21) Appl. No.: 13/334,012

(22) Filed: Dec. 21, 2011

(65) Prior Publication Data

US 2013/0093491 A1    Apr. 18, 2013

(30) Foreign Application Priority Data

Oct. 18, 2011    (KR) .......................... 10-2011-0106425

(51) Int. Cl.
*H03K 3/00*    (2006.01)

(52) U.S. Cl.
USPC .......................................................... 327/108

(58) Field of Classification Search
None
See application file for complete search history.

(56) References Cited

U.S. PATENT DOCUMENTS 8,030,987 B2 *    10/2011    Kang et al. ..................... 327/333

FOREIGN PATENT DOCUMENTS

KR    10-2008-0014543    2/2008
KR    10-0907017          7/2009

* cited by examiner

*Primary Examiner* — Lincoln Donovan
*Assistant Examiner* — Khareem E Almo
(74) *Attorney, Agent, or Firm* — IP & T Group LLP

(57) ABSTRACT

A level shifting circuit includes an inverter inverting an input voltage of an input node and driving a first voltage of a first node, a first output driving unit driving an output voltage of an output node to a first level in response to the first voltage of the first node, a first connection unit electrically coupling the first node to a second node or electrically isolating the first node from the second node in response to the first voltage of the first node, an internal driving unit driving a second voltage of the second node to a second level in response to the input voltage of the input node and the output voltage of the output node, and a second output driving unit driving the output voltage of the output node to the second level in response to the second voltage of the second node.

24 Claims, 5 Drawing Sheets

SEMICONDUCTOR DEVICE AND LEVEL SHIFTING CIRCUIT FOR THE SAME

CROSS-REFERENCE TO RELATED APPLICATIONS

The present application claims priority of Korean Patent Application No. 10-2011-0106425, filed on Oct. 18, 2011, which is incorporated herein by reference in its entirety.

BACKGROUND

1. Field

Exemplary embodiments of the present invention relate to a semiconductor device and, more particularly, to a level shifting circuit for use in the semiconductor device.

2. Description of the Related Art

In a semiconductor device such as a semiconductor memory device, as power consumption is reduced, the level of a voltage supplied thereto is lowered. Accordingly, in order to supply a signal with a specific voltage level applied from the outside of a semiconductor memory device to an internal circuit of the semiconductor memory device as a boosting voltage (or a back bias voltage), a level shifting circuit is used to convert a low voltage level to a high voltage level (or convert a high voltage level to a low voltage level). That is, the level shifting circuit may be employed to interface various circuits using voltages with levels different from each other.

For example, while a word line driver of the semiconductor memory device uses a boosting voltage VPP higher than an external voltage VDD as a power supply voltage, a signal swing between the external voltage VDD and a ground voltage VSS may be applied to drive the word line driver. When a circuit using the external voltage VDD as a power supply voltage is coupled to a circuit using the boosting voltage VPP as the power supply voltage, the level shifting circuit may be used.

A generally used level shifting circuit has been disclosed in Korean Patent Application No. 10-2006-0076417, entitled as "level shifter of semiconductor memory apparatus," Korean Patent Registration No. 10-0907017, entitled as "level circuit of semiconductor memory apparatus," and the like. Korean Patent Application No. 10-2006-0076417 discloses a level shifter driven by a single power supply voltage. Korean Patent Registration No. 10-0907017 discloses a level shifting circuit in which a current control unit is provided between nodes for coupling a pull-up element to a pull-down element to control a pull-up current delivered to an internal node or an output node, thereby allowing the voltage level of the internal node or the output node to quickly fall and rise, and resulting in the achievement of a stable and fast operating speed. However, the conventional art does not propose a detailed technology capable of stably operating with a smaller power supply voltage, e.g., a voltage smaller than 1.5 V, without error.

SUMMARY

Exemplary embodiments of the present invention are directed to a level shifting circuit capable of stably operating even in a low power supply voltage.

In accordance with an exemplary embodiment of the present invention, a level shifting circuit includes an inverter configured to invert an input voltage of an input node and drive a first voltage of a first node, a first output driving unit configured to drive an output voltage of an output node to a first level in response to the first voltage of the first node, a first connection unit configured to electrically couple the first node to a second node or electrically isolate the first node from the second node in response to the first voltage of the first node, an internal driving unit configured to drive a second voltage of the second node to a second level in response to the input voltage of the input node and the output voltage of the output node, and a second output driving unit configured to drive the output voltage of the output node to the second level in response to the second voltage of the second node.

The internal driving unit may include a second connection section including a first end coupled to the second node and a second end coupled to a third node, and configured to electrically couple the second node to the third node or electrically isolate the second node from the third node in response to the input voltage of the input node, and an internal node driving section including one end coupled to the third node, and configured to drive a third voltage of the third node to the second level when the output voltage of the output node is at the first level.

In accordance with an exemplary embodiment of the present invention, a level shifting circuit includes an inverter configured to invert an input voltage of an input node and drive a first voltage of a first node, a first connection unit configured to electrically couple the first node to a second node or electrically isolate the first node from the second node in response to the first voltage of the first node, a first output driving unit configured to drive an output voltage of an output node to a first level in response to a second voltage of the second node, a first internal driving unit configured to drive the second voltage of the second node to the first level in response to the input voltage of the input node and the output voltage of the output node, a second connection unit configured to electrically couple the first node to a third node or electrically isolate the first node from the third node in response to the first voltage of the first node, a second output driving unit configured to drive the output voltage of the output node to a second level in response to a third voltage of the third node; and a second internal driving unit configured to drive the third voltage of the third node to the second level in response to the input voltage of the input node and the output voltage of the output node.

In accordance with an exemplary embodiment of the present invention, a semiconductor device includes an inverter configured to invert an input voltage of an input node and drive a first voltage of a first node, a first driving unit configured to transfer the first voltage of the first node to a second node in response to the first voltage of the first node, or drive a second voltage of the second node to a first level in response to the input voltage of the input node and an output voltage of an output node, and a second driving unit configured to drive the output voltage of the output node to a second level in response to the first voltage of the first node and drive the output voltage of the output node to the first level in response to the second voltage the second node.

The first driving unit may include a first connection section configured to electrically couple the first node to the second node or electrically isolate the first node from the second node in response to the voltage at the first node, a second connection section including a first end coupled to the second node and a second end coupled to a third node, and configured to electrically couple the second node to the third node or electrically isolate the second node from the third node in response to the input voltage of the input node, and an internal node driving section including one end coupled to the third node, and configured to drive a third voltage of the third node to the first level when the output voltage of the output node is at the second level.

DETAILED DESCRIPTION

Figure 1A:
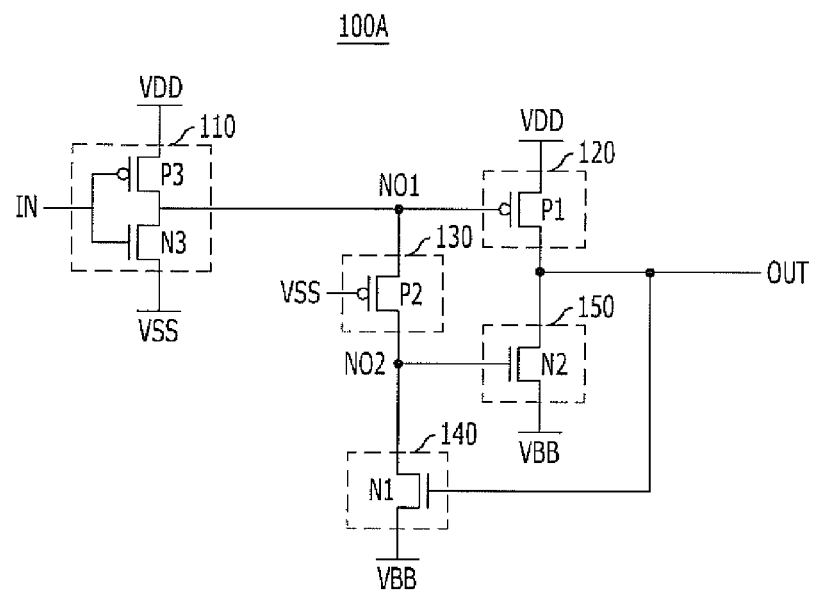
FIG. 1A is a circuit diagram of a level shifting circuit for outputting a back-bias voltage.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Hereinafter, a boosting voltage VDDP represents a voltage with a level higher than that of a power supply voltage VDD, and a back-bias voltage VBB represents a voltage with a level lower than that of a ground voltage VSS. The power supply voltage VDD corresponds to a 'high' level (a logic value 'high') and the ground voltage VSS corresponds to a 'low' level (a logic value 'low'). Accordingly, a signal of the power supply voltage VDD is inverted to obtain a signal of the ground voltage VSS, and a signal of the ground voltage VSS is inverted to obtain a signal of the power supply voltage VDD. The meaning of "a voltage at a node is a voltage A" is substantially equal to the meaning of "a voltage at a node has a voltage level A". For example, the meaning of "a voltage at a node is a power supply voltage" is substantially equal to the meaning of "a voltage at a node has a power supply voltage level". Applying a specific voltage to a specific node represents that the specific node is driven with the specific voltage.

In relation to the operation of a transistor, while the amount of a current flowing through both ends of the transistor is increased as the transistor is more fully turned on, the amount of the current is reduced as the transistor is not sufficiently turned on.

Figure 1B:
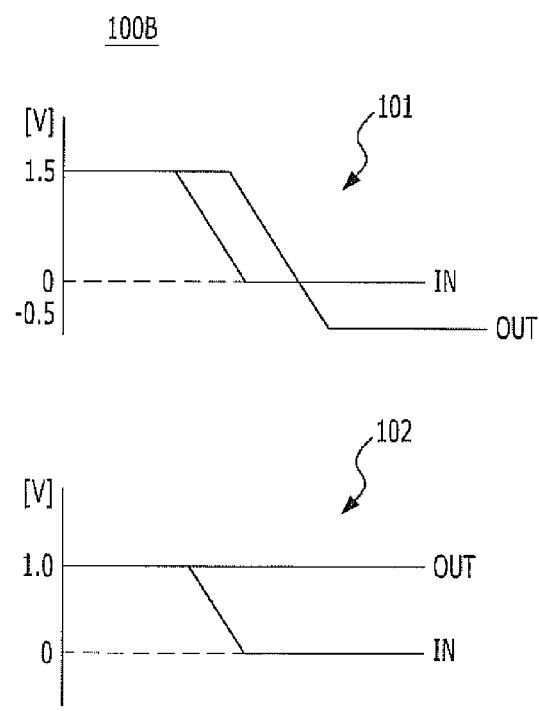
FIG. 1B is a waveform diagram illustrating features of the level shifting circuit shown in FIG. 1A.

FIG. 1A is a diagram of a level shifting circuit 100A for outputting a back-bias voltage VBB, and FIG. 1B is a waveform diagram 100B illustrating the operation and features of the level shifting circuit 100A.

As illustrated in FIG. 1A, the level shifting circuit 100A includes an inverter 110, a first output driving unit 120, a connection unit 130, an internal driving unit 140, and a second output driving unit 150.

Hereinafter, an operation of the level shifting circuit 100A will be described with reference to FIG. 1A.

The inverter 110 is configured to invert a voltage at an input node IN and drive a first node NO1. The voltage at the input node IN may be a power supply voltage VDD or a ground voltage VSS. When the voltage at the input node IN is the power supply voltage VDD, a voltage at the first node NO1 becomes the ground voltage VSS. Meanwhile, when the voltage at the input node IN is the ground voltage VSS, the voltage at the first node NO1 becomes the power supply voltage VDD. The inverter 110 may include an NMOS transistor N3 (hereinafter, referred to as 'N3') and a PMOS transistor P3 (hereinafter, referred to as 'P3').

The first output driving unit 120 is configured to drive an output node OUT with the power supply voltage VDD when the voltage at the first node NO1 is the ground voltage VSS. For such an operation, the first output driving unit 120 may include a PMOS transistor P1 (hereinafter, referred to as 'P1') provided with one end coupled to the output node OUT, the other end to which the power supply voltage VDD is applied, and a gate to which the voltage at the first node NO1 is input.

The connection unit 130 is configured to electrically couple the first node NO1 to a second node NO2, when the voltage at the first node NO1 is the power supply voltage VDD, and electrically isolate the first node NO1 from the second node NO2 when the voltage at the first node NO1 is the ground voltage VSS. For such an operation, the connection unit 130 may include a PMOS transistor P2 (hereinafter, referred to as 'P2') provided with one end coupled to the first node NO1, the other end coupled to the second node NO2, and a gate to which the ground voltage VSS is input.

The internal driving unit 140 is configured to apply a back-bias voltage VBB to the second node NO2 when a voltage at the output node OUT is the power supply voltage VDD. For such an operation, the internal driving unit 140 may include an NMOS transistor N1 (hereinafter, referred to as 'N1') provided with one end coupled to the second node NO2, the other end to which the back-bias voltage VBB is applied, and a gate to which the voltage at the output node OUT is input.

The second output driving unit 150 is configured to drive the output node OUT with the back-bias voltage VBB when a voltage at the second node NO2 is the power supply voltage VDD. For such an operation, the second output driving unit 150 may include an NMOS transistor N2 (hereinafter, referred to as 'N2') provided with one end coupled to the output node OUT, the other end to which the back-bias voltage VBB is applied, and a gate to which the voltage at the second node NO2 is input.

With such a configuration, the level shifting circuit 100A drives the output node OUT with the power supply voltage VDD, when the voltage at the input node IN is the power supply voltage VDD, and drives the output node OUT with the back-bias voltage VBB when the voltage at the input node IN is the ground voltage VSS.

Referring to FIG. 1B, the waveform diagram 100B illustrates the operation of the level shifting circuit 100A depending on the level of the power supply voltage VDD. A first waveform diagram 101 illustrates the waveform of the voltage at the input node IN and the waveform of the voltage at the output node OUT in respect to the voltage at the input node IN when the power supply voltage VDD is 1.5 V. A second waveform diagram 102 illustrates the waveform of the voltage at the input node IN and the waveform of the voltage at the output node OUT in response to the voltage at the input node IN when the power supply voltage VDD is 1.0 V.

The operation of the level shifting circuit 100A will be described based on the first waveform diagram 101.

First, when the voltage at the input node IN is the power supply voltage VDD, the voltage at the first node NO1 is the ground voltage VSS, the 'P1' is turned on, and the output node OUT is driven with the power supply voltage VDD. At this time, since the voltage at the first node NO1 is the ground voltage VSS, the 'P2' is turned off. The 'N1' is turned on in response to the voltage (the power supply voltage VDD) of the output node OUT, so that the back-bias voltage VBB is applied to the second node NO2. The 'N2' is turned off in response to the voltage at the second node NO2, which is the back-bias voltage VBB.

Then, when the voltage at the input node IN falls to the ground voltage VSS, the voltage at the first node NO1 rises to the power supply voltage VDD. Thus, the 'P1' is turned off. At this time, since the voltage at the first node NO1 is the power supply voltage VDD, the 'P2' is turned on and the first node NO1 is electrically connected to the second node NO2. When the voltage at the second node NO2 rises to the power supply voltage VDD which is the voltage at the first node NO1, the 'N2' is turned on and the output node OUT is driven with the back-bias voltage VBB. The 'N1' is turned off in response to the voltage at the output node OUT, which is the back-bias voltage VBB.

Here, the output node OUT may be driven up to the level of the back-bias voltage VBB when the voltage at the second node NO2 adequately rises to the power supply voltage VDD and the 'N2' is fully turned on in response to the voltage at the second node NO2. However, before the voltage at the output node OUT falls to the back-bias voltage VBB after the voltage at the input node IN falls to the ground voltage VSS, there is such a time period that all of the 'P3', the 'P2', and the 'N1' are in a turned-on state. Thus, a current path is formed between a power supply voltage VDD terminal coupled to the 'P3' and a back-bias voltage VBB terminal coupled to the 'N1'.

Therefore, when the second node NO2 is not driven with a adequately high power supply voltage VDD, since charge is not sufficiently accumulated in the second node NO2, that is, the voltage at the second node NO2 does not adequately rise, the 'N2' is not fully turned on. If the 'N2' is not fully turned on, the output node OUT may not be properly driven with the back-bias voltage VBB.

The second waveform diagram 102 illustrates the above-mentioned features. As illustrated in the first waveform diagram 101, when the power supply voltage VDD is 1.5 V, the second node NO2 is adequately pulled up, so that the output node OUT is properly driven with the back-bias voltage VBB. Meanwhile, when the power supply voltage VDD is 1.0 V, the voltage at the second node NO2 does not adequately rise due to the above-mentioned current path. Therefore, as illustrated in the second waveform diagram 102, the output node OUT is not properly driven with the back-bias voltage VBB, resulting in the occurrence of an error.

Figure 2A:
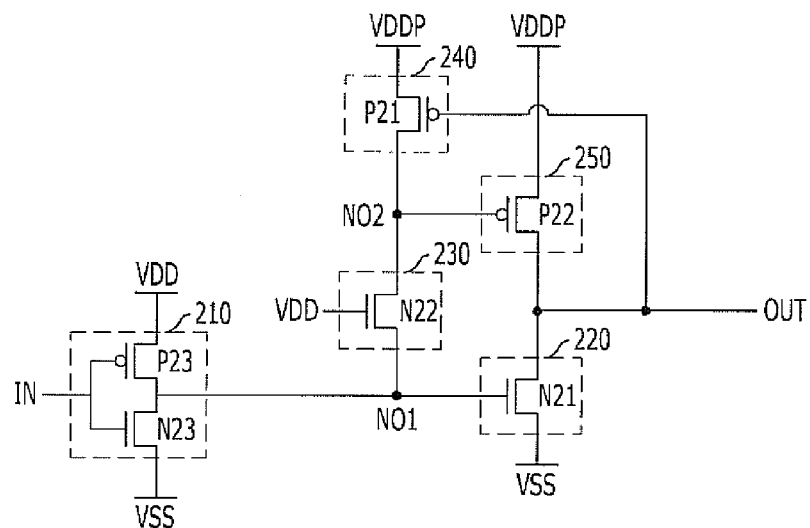
FIG. 2A is a circuit diagram of a level shifting circuit for outputting a boosting voltage.
Figure 2B:
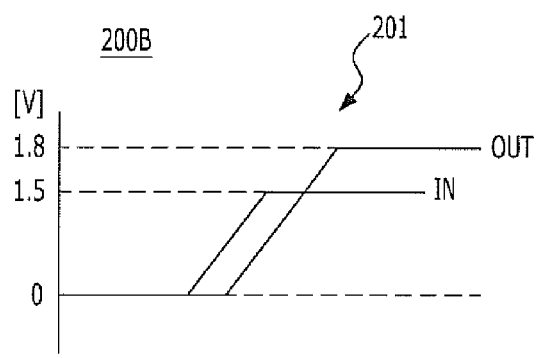
FIG. 2B is a waveform diagram illustrating features of the level shifting circuit shown in FIG. 2A.
Figure 2B:
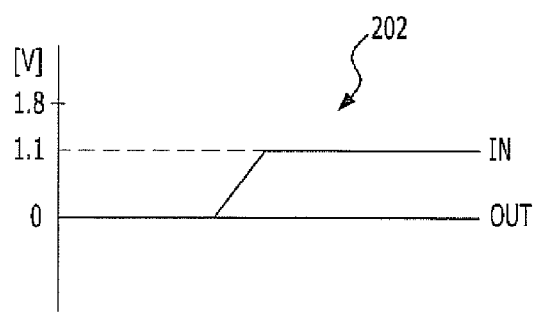

FIG. 2A is a diagram of a level shifting circuit 200A for outputting a boosting voltage VDDP, and FIG. 2B is a waveform diagram 200B illustrating the operation and features of the level shifting circuit 200A.

As illustrated in FIG. 2A, the level shifting circuit 200A includes an inverter 210, a first output driving unit 220, a connection unit 230, an internal driving unit 240, and a second output driving unit 250.

Hereinafter, an operation of the level shifting circuit 200A will be described with reference to FIG. 2A.

The inverter 210 is configured to invert a voltage at an input node IN and drive a first node NO1. Detailed operation of the inverter 210 is substantially the same as that of the inverter 110 described in FIG. 1A.

The first output driving unit 220 is configured to drive an output node OUT with the ground voltage VSS when the voltage at a first node NO1 is the power supply voltage VDD. For such an operation, the first output driving unit 220 may include an NMOS transistor N21 (hereinafter, referred to as 'N21') provided with one end coupled to the output node OUT, the other end to which the ground voltage VSS is applied, and a gate to which the voltage at the first node NO1 is input.

The connection unit 230 is configured to electrically couple the first node NO1 to a second node NO2, when the voltage at the first node NO1 is the ground voltage VSS, and electrically isolate the first node NO1 from the second node NO2 when the voltage at the first node NO1 is the power supply voltage VDD. For such an operation, the connection unit 230 may include an NMOS transistor N22 (hereinafter, referred to as 'N22') provided with one end coupled to the first node NO1, the other end coupled to the second node NO2, and a gate to which the power supply voltage VDD is input.

The internal driving unit 240 is configured to apply a boosting voltage VDDP to the second node NO2 when a voltage at the output node OUT is the ground voltage VSS. For such an operation, the internal driving unit 240 may include a PMOS transistor P21 (hereinafter, referred to as 'P21') provided with one end coupled to the second node NO2, the other end to which the boosting voltage VDDP is applied, and a gate to which the voltage at the output node OUT is input.

The second output driving unit 250 is configured to drive the output node OUT with the boosting voltage VDDP when a voltage at the second node NO2 is the ground voltage VSS. For such an operation, the second output driving unit 250 may include a PMOS transistor P22 (hereinafter, referred to as 'P22') provided with one end coupled to the output node OUT, the other end to which the boosting voltage VDDP is applied, and a gate to which the voltage at the second node NO2 is input.

With such a configuration, the level shifting circuit 200A drives the output node OUT with the ground voltage VSS, when the voltage at the input node IN is the ground voltage VSS, and drives the output node OUT with the boosting voltage VDDP when the voltage at the input node IN is the power supply voltage VDD.

Referring to FIG. 2B, the waveform diagram 200B illustrates the operation of the level shifting circuit 200A depending on the level of the power supply voltage VDD. A first waveform diagram 201 illustrates the waveform of the voltage at the input node IN and the waveform of the voltage at the output node OUT in respect to the voltage at the input node IN when the power supply voltage VDD is 1.5 V. A second waveform diagram 202 illustrates the waveform of the voltage at the input node IN and the waveform of the voltage at the output node OUT in respect to the voltage at the input node IN when the power supply voltage VDD is 1.1 V.

The operation of the level shifting circuit 200A will be described based on the first waveform diagram 201.

First, when the voltage at the input node IN is the ground voltage VSS, the voltage at the first node NO1 is the power supply voltage VDD and the 'N21' is turned on, so that the output node OUT is driven with the ground voltage VSS. At this time, since the voltage at the first node NO1 is the power supply voltage VDD, the 'N22' is turned off. The 'P21' is turned on in response to the voltage (the ground voltage VSS)

at the output node OUT, so that the boosting voltage VDDP is applied to the second node NO2. The 'P22' is turned off in response to the voltage at the second node NO2, which is the boosting voltage VDDP.

Then, when the voltage at the input node IN rises to the power supply voltage VDD (here, 1.5 V), the voltage at the first node NO1 falls to the ground voltage VSS. Thus, the 'N21' is turned off. At this time, since the voltage at the first node NO1 is the ground voltage VSS, the 'N22' is turned on and the first node NO1 is electrically connected to the second node NO2. When the voltage at the second node NO2 falls to the ground voltage VSS which is the voltage at the first node NO1, the 'P22' is turned on, so that the output node OUT is driven with the boosting voltage VDDP. The 'P21' is turned off in response to the voltage at the output node OUT, which is the boosting voltage VDDP.

Here, the output node OUT may be driven up to the level of the boosting voltage VDDP when the voltage at the second node NO2 adequately falls to the ground voltage VSS and the 'P22' is fully turned on in response to the voltage at the second node NO2. However, before the voltage at the output node OUT rises to the boosting voltage VDDP after the voltage at the input node IN rises to the power supply voltage VDD, there if such a time period that all of the 'N23', the 'N22', and the 'P21' are in a turned-on state. Thus, a current path is formed between a ground voltage VSS terminal coupled to the 'N23' and a boosting voltage VDDP terminal coupled to the 'P21'.

Accordingly, when the 'N23' is not turned on by a adequately high power supply voltage VDD, since charge is not sufficiently discharged from the second node NO2 (that is, the voltage at the second node NO2 does not adequately fall to the ground voltage VSS, the 'P22' is not fully turned on. Therefore, the output node OUT may not be properly driven with the boosting voltage VDDP.

The second waveform diagram 202 illustrates the above-mentioned features. As illustrated in the first waveform diagram 201, when the power supply voltage VDD is 1.5 V, the second node NO2 is adequately pulled down, so that the output node OUT is properly driven with the boosting voltage VDDP. Meanwhile, when the power supply voltage VDD is 1.1 V, the voltage at the second node NO2 does not adequately fall due to the above-mentioned current path. Therefore, as illustrated in the second waveform diagram 202, the output node OUT is not properly driven with the boosting voltage VDDP, resulting in the occurrence of an error.

Figure 3A:
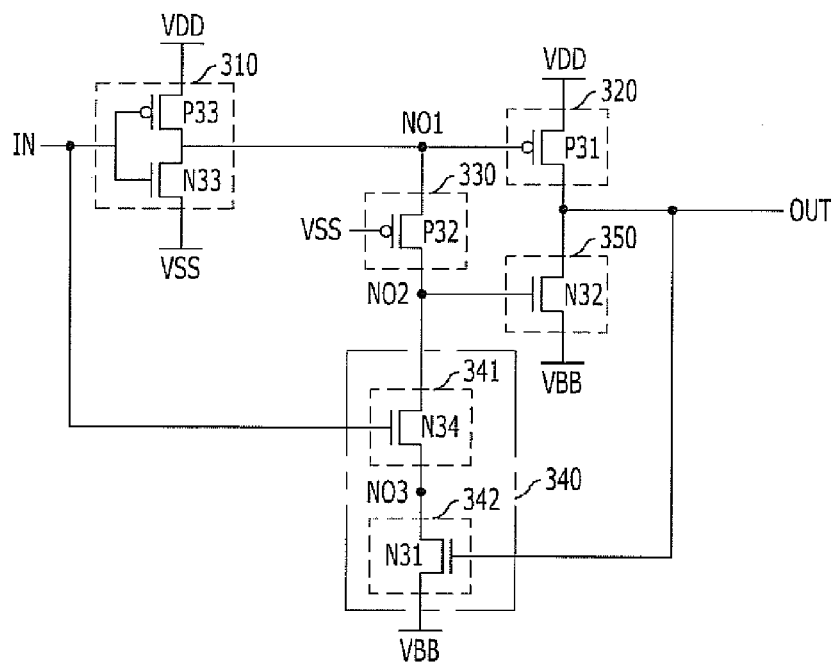
FIG. 3A is a circuit diagram of a level shifting circuit for outputting a back-bias voltage in accordance with an exemplary embodiment of the present invention.
Figure 3B:
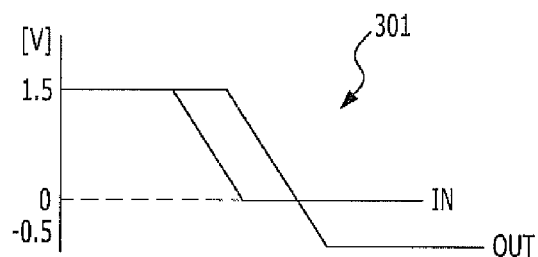
FIG. 3B is a waveform diagram illustrating an operation of the level shifting circuit shown in FIG. 3A.

FIG. 3A is a diagram of a level shifting circuit 300A for outputting a back-bias voltage VBB in accordance with an exemplary embodiment of the present invention, and FIG. 3B is a waveform diagram 300B illustrating an operation of the level shifting circuit 300A.

As illustrated in FIG. 3A, the level shifting circuit 300A includes an inverter 310, a first output driving unit 320, a first connection unit 330, an internal driving unit 340, and a second output driving unit 350.

The inverter 310 is configured to invert a voltage at an input node IN and drive a first node NO1. The first output driving unit 320 is configured to drive a voltage at an output node OUT to a first level in response to a voltage at the first node NO1. The first connection unit 330 is configured to electrically couple the first node NO1 to a second node NO2 or electrically isolate the first node NO1 from the second node NO2 in response to the voltage at the first node NO1. The internal driving unit 340 is configured to drive a voltage at the second node NO2 to a second level in response to the voltage at the input node IN and the voltage at the output node OUT. The second output driving unit 350 is configured to drive the voltage at the output node OUT to the second level in response to the voltage at the second node NO2.

A voltage with the first level is inverted to obtain a voltage with a third level, and the voltage with the third level is inverted to obtain the voltage with the first level. In the level shifting circuit 300A of FIG. 3A, the first level is a power supply voltage VDD level, the third level is a ground voltage VSS level, and the second level is a back-bias voltage VBB level lower than the ground voltage VSS level.

Hereinafter, the operation of the level shifting circuit 300A will be described with reference to FIG. 3A.

Description about the inverter 310, the first output driving unit 320, and the second output driving unit 350 is substantially the same as that about the inverter 110, the first output driving unit 120, and the second output driving unit 150 shown in FIG. 1A. Accordingly, for the sake of convenience, the description of the elements thereof will be omitted and the configuration and operation of the internal driving unit 340 will be mainly described.

The first connection unit 330 electrically couples the first node NO1 to the second node NO2 or electrically isolates the first node NO1 from the second node NO2 in response to the voltage at the first node NO1. In detail, the first connection unit 330 electrically couples the first node NO1 to the second node NO2, when the voltage at the first node NO1 is the power supply voltage VDD, and electrically isolates the first node NO1 from the second node NO2 when the voltage at the first node NO1 is the ground voltage VSS. For such an operation, the first connection unit 330 may include a PMOS transistor P32 (hereinafter, referred to as 'P32') provided with one end coupled to the first node NO1, the other end coupled to the second node NO2, and a gate to which the ground voltage VSS is input. In general, a PMOS transistor is turned on or off in response to a voltage applied to a gate thereof. However, in the 'P32' of FIG. 3A, since a voltage applied to the gate is fixed to the ground voltage VSS, the 'P32' is turned on or off in response to a voltage applied to a source (the first node NO1). That is, the first connection unit 330 electrically couples the first node NO1 to the second node NO2 or electrically isolates the first node NO1 from the second node NO2 in response to the voltage at the first node NO1.

The internal driving unit 340 drives the second node NO2 with the back-bias voltage VBB when both of the voltage at the input node IN and the voltage at the output node OUT are the power supply voltage VDD. For such an operation, the internal driving unit 340 includes a second connection section 341 and an internal node driving section 342. The second connection section 341 has one end coupled to the second node NO2 and the other end coupled to a third node NO3, and it electrically couples the second node NO2 to the third node NO3 or electrically isolates the second node NO2 from the third node NO3 in response to the voltage at the input node IN. The internal node driving section 342 has one end coupled to the third node NO3 and drives the third node NO3 with the back-bias voltage VBB when the voltage at the output node OUT is the power supply voltage VDD.

In detail, the second connection section 341 electrically couples the second node NO2 to the third node NO3, when the voltage at the input node IN is the power supply voltage VDD, and electrically isolates the second node NO2 from the third node NO3 when the voltage at the input node IN is the ground voltage VSS. That is, when the voltage at the input node IN is the ground voltage VSS, the second connection section 341 prevents the second node NO2 from being driven with the back-bias voltage VBB.

The second connection section 341 may include an NMOS transistor N34 (hereinafter, referred to as 'N34') provided with one end coupled to the second node NO2, the other end coupled to the third node NO3, and a gate to which the voltage at the input node IN is input. The internal node driving section 342 may include an NMOS transistor N31 (hereinafter, referred to as 'N31') provided with one end coupled to the third node NO3, the other end to which the back-bias voltage VBB is applied, and a gate to which the voltage at the output node OUT is input.

The internal driving unit 340 of the level shifting circuit 300A of FIG. 3A drives the second node NO2 with the back-bias voltage VBB in response to both the voltage at the input node IN and the voltage at the output node OUT, differently from the level shifting circuit 100A of FIG. 1A. In this way, the current path described in FIG. 1A is not formed between the power supply voltage VDD terminal and the back-bias voltage VBB terminal. Detailed description will be given with reference to the waveform diagram 300B shown in FIG. 3B.

Referring to FIG. 3B, the waveform diagram 300B illustrates the operation of the level shifting circuit 300A depending on the level of the power supply voltage VDD. A first waveform diagram 301 illustrates the waveform of the voltage at the input node IN and the waveform of the voltage at the output node OUT in respect to the voltage at the input node IN when the power supply voltage VDD is 1.5 V. A second waveform diagram 302 illustrates the waveform of the voltage at the input node IN and the waveform of the voltage at the output node OUT in respect to the voltage at the input node IN when the power supply voltage VDD is 1.0 V.

The operation of the level shifting circuit 300A will be described based on the first waveform diagram 301.

When the voltage at the input node IN is the power supply voltage VDD, the operation of the level shifting circuit 300A is similar to that described in the waveform diagram 100B of FIG. 1A. Since an added 'N34' is turned on in response to the voltage (the power supply voltage VDD) of the input node IN, the back-bias voltage VBB is applied to the second node NO2 through the 'N31' and the 'N34'.

Then, when the voltage at the input node IN falls to the ground voltage VSS, the voltage at the first node NO1 rises to the power supply voltage VDD. Thus, the 'P31' is turned off and the 'P32' is turned on, so that the first node NO1 is electrically connected to the second node NO2. Simultaneously, the added transistor 'N34' is turned off in response to the voltage (the ground voltage VSS) of the input node IN. Thus, the current path formed between the power supply voltage VDD terminal coupled to the 'P3' and the back-bias voltage VBB terminal coupled to the 'N1' in the level shifting circuit 100A shown FIG. 1A is not formed by the turned-off 'N34' in the level shifting circuit 300A shown in FIG. 3A.

Consequently, even when the level shifting circuit 300A operates with a low power supply voltage VDD as illustrated in the second waveform diagram 302, since no charge is discharged from the second node NO2 differently from the level shifting circuit 100A shown in FIG. 1A, the voltage at the second node NO2 adequately rises and the 'N32' is fully turned on, so that the voltage at the output node OUT falls to the back-bias voltage VBB. That is, in the case that the voltage at the input node IN is the ground voltage VSS, even when the power supply voltage VDD is low (for example, 1.0 V), the 'N34' is turned off and the voltage at the second node NO2 rises to the power supply voltage VDD, so that the output node OUT may be driven with the back-bias voltage VBB.

Figure 4A:
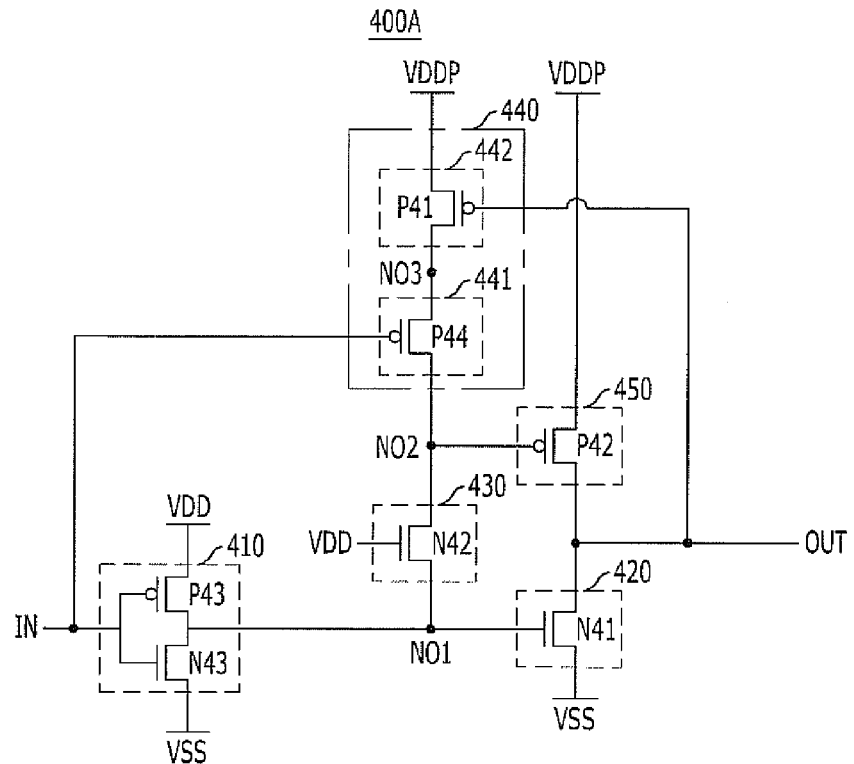
FIG. 4A is a circuit diagram of a level shifting circuit for outputting a boosting voltage in accordance with an exemplary embodiment of the present invention.
Figure 4B:
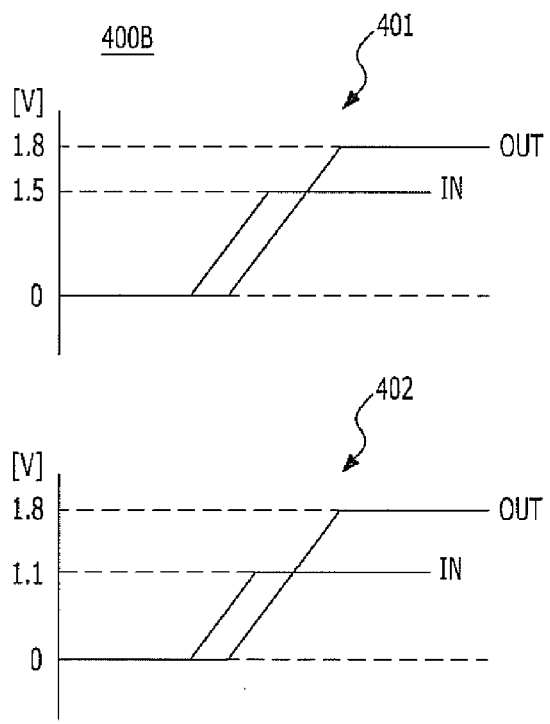
FIG. 4B is a waveform diagram illustrating an operation of the level shifting circuit shown in FIG. 4A.

FIG. 4A is a diagram of a level shifting circuit 400A for outputting a boosting voltage VDDP in accordance with an exemplary embodiment of the present invention, and FIG. 4B is a waveform diagram 400B illustrating an operation of the level shifting circuit 400A.

As illustrated in FIG. 4A, the level shifting circuit 400A includes an inverter 410, a first output driving unit 420, a first connection unit 430, an internal driving unit 440, and a second output driving unit 450.

The inverter 410 is configured to invert a voltage at an input node IN and drive a first node NO1. The first output driving unit 420 is configured to drive a voltage at an output node OUT to a first level in response to a voltage at the first node NO1. The first connection unit 430 is configured to electrically couple the first node NO1 to a second node NO2 or electrically isolate the first node NO1 from the second node NO2 in response to the voltage at the first node NO1. The internal driving unit 440 is configured to drive a voltage at the second node NO2 to a second level in response to the voltage at the input node IN and the voltage at the output node OUT. The second output driving unit 450 is configured to drive the voltage at the output node OUT to the second level in response to the voltage at the second node NO2.

A voltage with the first level is inverted to obtain a voltage with a third level, and the voltage with the third level is inverted to obtain the voltage with the first level. In the level shifting circuit 400A of FIG. 4A, the first level is a ground voltage VSS level, the third level is a power supply voltage VDD level, and the second level is a boosting voltage VDDP level higher than the power supply voltage VDD level.

Hereinafter, the operation of the level shifting circuit 400A will be described with reference to FIG. 4A.

Description about the inverter 410, the first output driving unit 420, and the second output driving unit 450 is substantially the same as that about the inverter 210, the first output driving unit 220, and the second output driving unit 250 of FIG. 2A. Accordingly, the description of the elements will be omitted and the configuration and operation of the internal driving unit 440 will be mainly described.

The first connection unit 430 electrically couples the first node NO1 to the second node NO2 or electrically isolates the first node NO1 from the second node NO2 in response to the voltage at the first node NO1. In detail, the first connection unit 430 electrically couples the first node NO1 to the second node NO2, when the voltage at the first node NO1 is the ground voltage VSS, and electrically isolates the first node NO1 from the second node NO2 when the voltage at the first node NO1 is the power supply voltage VDD. For such an operation, the first connection unit 430 may include an NMOS transistor N42 (hereinafter, referred to as 'N42') provided with one end coupled to the first node NO1, the other end coupled to the second node NO2, and a gate to which the power supply voltage VDD is input. In general, an NMOS transistor is turned on or off in response to a voltage applied to a gate thereof. However, in the 'N42' of FIG. 4A, since a voltage applied to the gate is fixed to the power supply voltage VDD, the 'N42' is turned on or off in response to a voltage applied to a source (the first node NO1). That is, the first connection unit 430 electrically couples the first node NO1 to the second node NO2 or electrically isolates the first node NO1 from the second node NO2 according to (in response to) the voltage at the first node NO1.

The internal driving unit 440 drives the second node NO2 with the boosting voltage VDDP when the voltage at the input node IN and the voltage at the output node OUT are the ground voltage VSS. For such an operation, the internal driving unit 440 includes a second connection section 441 and an internal node driving section 442. The second connection section 441 has one end coupled to the second node NO2 and the other end coupled to the third node NO3, and it electrically couples the second node NO2 to the third node NO3 or electrically isolates the second node NO2 from the third node NO3 in response to the voltage at the input node IN. The internal node driving section 442 has one end coupled to the third node NO3 and drives the third node NO3 with the boosting voltage VDDP when the voltage at the output node OUT is the ground voltage VSS.

The second connection section 441 electrically couples the second node NO2 to the third node NO3, when the voltage at the input node IN is the ground voltage VSS, and electrically isolates the second node NO2 from the third node NO3 when the voltage at the input node IN is the power supply voltage VDD. That is, when the voltage at the input node IN is the power supply voltage VDD, the second connection section 441 prevents the second node NO2 from being driven with the boosting voltage VDDP.

The second connection section 441 may include a PMOS transistor P44 (hereinafter, referred to as 'P44') provided with one end coupled to the second node NO2, the other end coupled to the third node NO3, and a gate to which the voltage at the input node IN is input. The internal node driving section 442 may include a PMOS transistor P41 (hereinafter, referred to as 'P41') provided with one end coupled to the third node NO3, the other end to which the boosting voltage VDDP is applied, and a gate to which the voltage at the output node OUT is input.

The internal driving unit 440 of the level shifting circuit 400A of FIG. 4A drives the second node NO2 with the boosting voltage VDDP in response to both the voltage at the input node IN and the voltage at the output node OUT, differently from the level shifting circuit 200A of FIG. 2A. In this way, the current path described in FIG. 2A is not formed between the ground voltage VSS terminal and the boosting voltage VDDP terminal. Detailed description will be given with reference to the waveform diagram 400B of FIG. 4B.

Referring to FIG. 4B, the waveform diagram 400B illustrates the operation of the level shifting circuit 400A depending on the level of the power supply voltage VDD. A first waveform diagram 401 illustrates the waveform of the voltage at the input node IN and the waveform of the voltage at the output node OUT in respect to the voltage at the input node IN when the power supply voltage VDD is 1.5 V. A second waveform diagram 402 illustrates the waveform of the voltage at the input node IN and the waveform of the voltage at the output node OUT in respect to the voltage at the input node IN when the power supply voltage VDD is 1.1 V.

The operation of the level shifting circuit 400A will be described based on the first waveform diagram 401.

When the voltage at the input node IN is the ground voltage VSS, the operation of the level shifting circuit 400A is similar to that described in the waveform diagram 200B of FIG. 2A. Since an added 'P34' is turned on in response to the voltage (the ground voltage VSS) of the input node IN, the boosting voltage VDDP is applied to the second node NO2 through the 'P41' and the 'P44'.

Then, when the voltage at the input node IN rises to the power supply voltage VDD, the voltage at the first node NO1 falls to the ground voltage VSS. Thus, the 'N41' is turned off and the 'N42' is turned on, so that the first node NO1 is electrically connected to the second node NO2. Simultaneously, the added transistor 'P44' is turned off in response to the voltage (the power supply voltage VDD) of the input node IN. Thus, the current path formed between the ground voltage VSS terminal coupled to the 'N23' and the boosting voltage VDDP terminal coupled to the 'P21' in the level shifting circuit 200A of FIG. 2A is not formed by the turned-off 'P44' in the level shifting circuit 400A of FIG. 4A.

Consequently, even when the level shifting circuit 400A operates with a low power supply voltage VDD as illustrated in the second waveform diagram 402, since no current flows from the boosting voltage VDDP terminal to the ground voltage VSS terminal differently from the level shifting circuit 200A of FIG. 2A, no charge is discharge from the second node NO2, so that the voltage at the second node NO2 adequately falls, the 'P42' is fully turned on, and thus the voltage at the output node OUT rises to the boosting voltage VDDP. Such an operation is illustrated in the second waveform diagram 402. That is, in the case that the voltage at the input node IN is the power supply voltage VDD, even when the power supply voltage VDD is low (for example, 1.1 V), the 'P44' is turned off and the voltage at the second node NO2 falls to the ground voltage VSS, so that the output node OUT may be driven with the boosting voltage VDDP.

The level shifting circuit 300A in accordance with another exemplary embodiment of the present invention will be described with reference to FIG. 3A.

As illustrated in FIG. 3A, the level shifting circuit 300A includes an inverter 310, an internal driving unit, and an output driving unit. The inverter 310 is configured to invert a voltage at an input node IN and drive a first node NO1. The internal driving unit is configured to transfer a voltage at the first node NO1 to a second node NO2 in response to the voltage at the first node NO1 or drive a voltage at the second node NO2 to a first level in response to the voltage at the input node IN and a voltage at an output node OUT. The output driving unit is configured to drive the voltage at the output node OUT to a second level in response to the voltage at the first node NO1 or drive the voltage at the output node OUT to the first level in response to the voltage at the second node NO2.

Figure 3B:
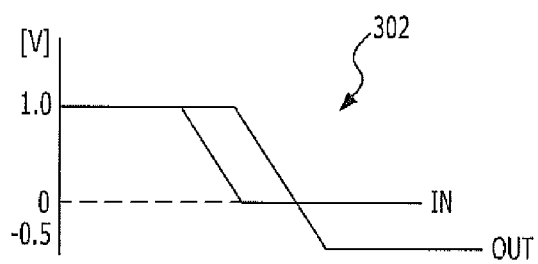

A voltage with the second level (corresponds to the first level in the description of FIG. 3) is inverted to obtain a voltage with a third level (corresponds to the third level in the description of FIG. 3), and the voltage with the third level is inverted to obtain the voltage with the second level. The second level is a power supply voltage VDD level, the third level is a ground voltage VSS level, and the first level (corresponds to the second level in the description of FIG. 3) is a back-bias voltage VBB level lower than the ground voltage VSS level.

Hereinafter, the operation of the level shifting circuit 300A will be described with reference to FIGS. 3A and 3B.

The inverter 310 is configured to invert the voltage at the input node IN and drive the first node NO1.

When the voltage at the first node NO1 is the power supply voltage VDD, the internal driving unit electrically couples the first node NO1 to the second node NO2 and drives the second node NO2 with the power supply voltage VDD. Meanwhile, when the voltage at the input node IN and the voltage at the output node OUT are the power supply voltage VDD, the internal driving unit drives the second node NO2 with the back-bias voltage VBB. For such an operation, the internal driving unit includes a first connection section 330, a second connection section 341, and an internal node driving section 342. The first connection section 330 is configured to electrically couple the first node NO1 to the second node NO2 or electrically isolate the first node NO1 from the second node NO2 in response to the voltage at the first node NO1. The second connection section 341 has one end coupled to the second node NO2 and the other end coupled to a third node NO3, and it electrically couples the second node NO2 to the third node NO3 or electrically isolates the second node NO2 from the third node NO3 in response to the voltage at the input node IN. The internal node driving section 342 has one end coupled to the third node NO3 and drives the third node NO3 with the back-bias voltage VBB when the voltage at the output node OUT is the power supply voltage VDD.

The output driving unit drives the output node OUT with the power supply voltage VDD, when the voltage at the first node NO1 is the ground voltage VSS, and drives the output node OUT with the back-bias voltage VBB when the voltage at the second node NO2 is the power supply voltage VDD. For such an operation, the output driving unit includes a first output driving section 320 and a second output driving section 350. The first output driving section 320 is configured to drive the output node OUT with the power supply voltage VDD when the voltage at the first node NO1 is the ground voltage VSS. The second output driving unit 350 is configured to drive the output node OUT with the back-bias voltage VBB when the voltage at the second node NO2 is the power supply voltage VDD.

Since the connection states and detailed operations of the elements are substantially the same as those described in FIG. 3B, detailed description thereof will be omitted.

The level shifting circuit 400A in accordance with another embodiment of the present invention will be described with reference to FIGS. 4A and 4B.

As illustrated in FIG. 4A, the level shifting circuit 400A includes an inverter 410, an internal driving unit, and an output driving unit. The inverter 410 is configured to invert a voltage at an input node IN and drive a first node NO1. The internal driving unit is configured to transfer a voltage at the first node NO1 to a second node NO2 in response to the voltage at the first node NO1 or drive a voltage at the second node NO2 to a first level in response to the voltage at the input node IN and a voltage at an output node OUT. The output driving unit is configured to drive the voltage at the output node OUT to a second level in response to the voltage at the first node NO1 or drive the voltage at the output node OUT to the first level in response to the voltage at the second node NO2.

A voltage with the second level (corresponds to the first level in the description of FIG. 4A) is inverted to obtain a voltage with a third level (corresponds to the third level in the description of FIG. 4A), and the voltage with the third level is inverted to obtain the voltage with the second level. The second level is a ground voltage VSS level, the third level is a power supply voltage VDD level, and the first level (corresponds to the second level in the description of FIG. 4A) is a boosting voltage VDDP level higher than the power supply voltage VDD level.

Hereinafter, the operation of the level shifting circuit 400A will be described with reference to FIG. 4A.

The inverter 410 is configured to invert the voltage at the input node IN and drive the first node NO1.

When the voltage at the first node NO1 is the ground voltage VSS, the internal driving unit electrically couples the first node NO1 to the second node NO2 and drive the second node NO2 with the ground voltage VSS. Meanwhile, when the voltage at the input node IN and the voltage at the output node OUT are the ground voltage VSS, the internal driving unit drives the second node NO2 with the boosting voltage VDDP. For such an operation, the internal driving unit includes a first connection section 430, a second connection section 441, and an internal node driving section 442. The first connection section 430 is configured to electrically couple the first node NO1 to the second node NO2 or electrically isolate the first node NO1 from the second node NO2 in response to the voltage at the first node NO1. The second connection section 441 has one end coupled to the second node NO2 and the other end coupled to a third node NO3, and it electrically couples the second node NO2 to the third node NO3 or electrically isolates the second node NO2 from the third node NO3 in response to the voltage at the input node IN. The internal node driving section 442 has one end coupled to the third node NO3 and drives the third node NO3 with the boosting voltage VDDP when the voltage at the output node OUT is the ground voltage VSS.

The output driving unit drives the output node OUT with the ground voltage VSS, when the voltage at the first node NO1 is the power supply voltage VDD, and drives the output node OUT with the boosting voltage VDDP when the voltage at the second node NO2 is the ground voltage VSS. For such an operation, the output driving unit includes a first output driving section 420 and a second output driving section 450. The first output driving section 420 is configured to drive the output node OUT with the ground voltage VSS when the voltage at the first node NO1 is the power supply voltage VDD. The second output driving unit 450 is configured to drive the output node OUT with the boosting voltage VDDP when the voltage at the second node NO2 is the ground voltage VSS.

Since the connection states and detailed operations of the elements are substantially the same as those described in FIG. 4B, detailed description thereof will be omitted.

Figure 5:
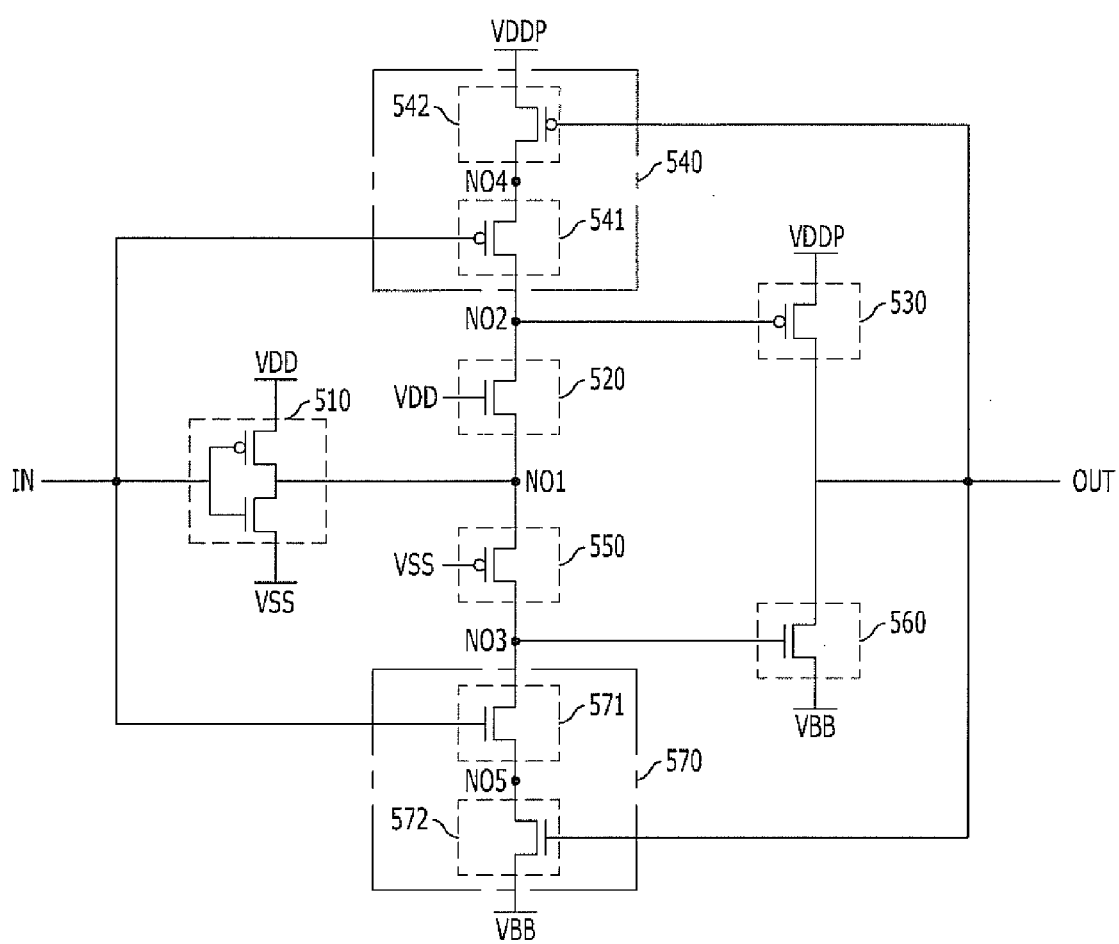
FIG. 5 is a circuit diagram of a level shifting circuit 500 for outputting a boosting voltage VDDP and a back-bias voltage VBB in accordance with another exemplary embodiment of the present invention.

FIG. 5 is a configuration diagram of a level shifting circuit 500 for outputting a boosting voltage VDDP and a back-bias voltage VBB in accordance with another embodiment of the present invention. The level shifting circuit 500 of FIG. 5 corresponds to a level shifting circuit obtained by adding the level shifting circuit 300A of FIG. 3A to the level shifting circuit 400A shown in FIG. 4A.

As illustrated in FIG. 5, the level shifting circuit 500 includes an inverter 510, a first connection unit 520, a first output driving unit 530, a first internal driving unit 540, a second connection unit 550, a second output driving unit 560, and a second internal driving unit 570. The inverter 510 is configured to invert a voltage at an input node IN and drive a first node NO1. The first connection unit 520 is configured to electrically couple the first node NO1 to a second node NO2 or electrically isolate the first node NO1 from the second node NO2 in response to the voltage at the first node NO1. The first output driving unit 530 is configured to drive a voltage at an output node OUT to a first level in response to a voltage at the second node NO2. The first internal driving unit 540 is configured to drive the voltage at the second node NO2 to the first level in response to the voltage at the input node IN and the voltage at the output node OUT. The second connection unit 550 is configured to electrically couple the first node NO1 to a third node NO3 or electrically isolate the first node NO1 from the third node NO3 in response to the voltage at the first node NO1. The second output driving unit 560 is configured to drive the voltage at the output node OUT to a second level in response to a voltage at the third node NO3. The second internal driving unit 570 is configured to drive the voltage at the third node NO3 to the second level in response to the voltage at the input node IN and the voltage at the output node OUT.

The voltage at the input node IN is a third level or a fourth level between the first level and the second level, a voltage with the third level is inverted to obtain a voltage with the fourth level, and the voltage with the fourth level is inverted to obtain the voltage with the third level. The third level (corresponds to the first level of FIG. 3A and the third level of FIG. 4A) is a power supply voltage VDD level, the fourth level (corresponds to the third level of FIG. 3A and the first level of FIG. 4A) is a ground voltage VSS level, the first level (corresponds to the second level of FIG. 4A) is a boosting voltage VDDP level higher than the power supply voltage VDD level, and the second level (corresponds to the second level of FIG. 3A) is a back-bias voltage VBB level lower than the ground voltage VSS level.

The inverter 510 inverts the voltage at the input node IN and drive the first node NO1.

When the voltage at the first node NO1 is the ground voltage VSS, the first connection unit 520 electrically couples the first node NO1 to a second node NO2. Meanwhile, when the voltage at the first node NO1 is the power supply voltage VDD, the first connection unit 520 electrically isolates the first node NO1 from the second node NO2. The first connection unit 520 corresponds to the first connection unit 430 of FIG. 4, the first node NO1 corresponds to the first nodes NO1 shown in FIGS. 3 and 4, and the second node NO2 corresponds to the second node NO2 shown in FIG. 4.

When the voltage at the first node NO1 is the power supply voltage VDD, the second connection unit 550 electrically couples the first node NO1 to the third node NO3. Meanwhile, when the voltage at the first node NO1 is the ground voltage VSS, the second connection unit 550 electrically isolates the first node NO1 from the third node NO3. The second connection unit 550 corresponds to the first connection unit 330 of FIG. 3A, and the third node NO3 corresponds to the second nodes NO2 shown in FIG. 3A.

The first internal driving unit 540 includes a third connection section 541 and a first internal node driving section 542. The third connection section 541 has one end coupled to the second node NO2 and the other end coupled to a fourth node NO4, and it electrically couples the second node NO2 to the fourth node NO4 or electrically isolates the second node NO2 from the fourth node NO4 in response to the voltage at the input node IN. The first internal node driving section 542 has one end coupled to the fourth node NO4 and drives the fourth node NO4 with the boosting voltage VDDP when the voltage at the output node OUT is the back-bias voltage VBB. The first internal driving unit 540, the third connection section 541, the first internal node driving section 542, and the fourth node NO4 correspond to the internal driving unit 440 shown in FIG. 4, the second connection section 441 shown in FIG. 4, the first internal node driving section 442 shown in FIG. 4, and the third node NO3 of FIG. 4, respectively.

The second internal driving unit 570 includes a fourth connection section 571 and a second internal node driving section 572. The fourth connection section 571 has one end coupled to the third node NO3 and the other end coupled to a fifth node NO5, and it electrically connects the third node NO3 to the fifth node NO5 or electrically isolates the third node NO3 from the fifth node NO5 in response to the voltage at the input node IN. The second internal node driving section 572 has one end coupled to the fifth node NO5 and drives the fifth node NO5 with the back-bias voltage VBB when the voltage at the output node OUT is the boosting voltage VDDP. The second internal driving unit 570, the fourth connection section 571, the second internal node driving section 572, and the fifth node NO5 correspond to the internal driving unit 340 of FIG. 3A, the second connection section 341 of FIG. 3A, the internal node driving section 342 of FIG. 3A, and the third node NO3 of FIG. 3A, respectively.

With such a configuration, the level shifting circuit 500 drives the output node OUT with the boosting voltage VDDP, when the voltage at the input node IN is the power supply voltage VDD, and drives the output node OUT with the back-bias voltage VBB when the voltage at the input node IN is the ground voltage VSS.

The process in which the output node OUT is driven with the boosting voltage VDDP when the voltage at the input node IN is the power supply voltage VDD is substantially the same as the process in which the output node OUT of the level shifting circuit 400A of FIG. 4 is driven with the boosting voltage VDDP, and the process in which the output node OUT is driven with the back-bias voltage VBB when the voltage at the input node IN is the ground voltage VSS is substantially the same as the process in which the output node OUT of the level shifting circuit 300A shown in FIG. 3A is driven with the back-bias voltage VBB. In addition, the process in which the third node NO3 is driven with the back-bias voltage VBB when the voltage at the input node IN is the power supply voltage VDD is substantially the same as the process in which the second node NO2 of the level shifting circuit 300A of FIG. 3A is driven with the back-bias voltage VBB. Moreover, the process in which the second node NO2 is driven with the boosting voltage VDDP when the voltage at the input node IN is the ground voltage VSS is substantially the same as the process in which the second node NO2 of the level shifting circuit 400A shown in FIG. 4A is driven with the boosting voltage VDDP.

Since the connection states and detailed operations of the elements are substantially the same as those described in FIGS. 3B and 4B, detailed description thereof will be omitted.

The level shifting circuit in accordance with the present invention may stably operate without changing the size of a component, e.g., a transistor, even when a voltage applied to an input node corresponding to a logic high level is smaller than 1.5 V.

While the present invention has been described with respect to the specific embodiments, it will be apparent to those skilled in the art that various changes and modifications may be made without departing from the spirit and scope of the invention as defined in the following claims.

What is claimed is:

1. A level shifting circuit comprising:
    an inverter configured to invert an input voltage of an input node and drive a first voltage of a first node;
    a first output driving unit configured to drive an output voltage of an output node to a first level in response to the first voltage of the first node;
    a first connection unit configured to electrically couple the first node to a second node or electrically isolate the first node from the second node in response to the first voltage of the first node;
    an internal driving unit configured to drive a second voltage of the second node to a second level in response to the input voltage of the input node and the output voltage of the output node, wherein the internal driving unit is directly coupled to both of the input node and the output node; and
    a second output driving unit configured to drive the output voltage of the output node to the second level in response to the second voltage of the second node.

2. The level shifting circuit of claim 1, wherein the input voltage swings between the first level and a third level and the input voltage of the first or third level is inverted to be outputted as an inverted voltage of the third or first level.

3. The level shifting circuit of claim 2, wherein the internal driving unit comprises:
    a second connection section including a first end coupled to the second node and a second end coupled to a third node and configured to electrically couple the second node to the third node or electrically isolate the second node from the third node in response to the input voltage of the input node; and
    an internal node driving section including one end coupled to the third node and configured to drive a third voltage of the third node to the second level when the output voltage of the output node is at the first level.

4. The level shifting circuit of claim 2, wherein the first output driving unit is configured to drive the output voltage of the output node to the first level when the first voltage of the first node is at the third level.

5. The level shifting circuit of claim 2, wherein the second output driving unit is configured to drive the output voltage of the output node to the second level when the second voltage of the second node is at the first level.

6. The level shifting circuit of claim 2, wherein the first connection unit electrically couples the first node to the second node, when the first voltage of the first node is at the first level, and electrically isolates the first node from the second node when the first voltage of the first node is at the third level.

7. The level shifting circuit of claim 3, wherein the second connection section is configured to prevent the second voltage of the second node from being driven to the second level when the input voltage of the input node is at the third level.

8. The level shifting circuit of claim 3, wherein the second connection section electrically couples the second node to the third node, when the input voltage of the input node is at the first level, and electrically isolates the second node from the third node when the input voltage of the input node is at the third level.

9. The level shifting circuit of claim 3, wherein the first level is a power supply voltage level, the third level is a ground voltage level, and the second level is a back-bias voltage level lower than the baseline voltage level.

10. The level shifting circuit of claim 9, wherein the first output driving unit comprises:
a first PMOS transistor including a first end to which a power supply voltage is applied, a second end coupled to the output node, and a gate to which the first voltage of the first node is input, the first end facing the second end,
wherein the second output driving unit comprises:
a first NMOS transistor including a first end to which a back-bias voltage is applied, a second end coupled to the output node, and a gate to which the second voltage of the second node is input, the first end facing the second end,
wherein the first connection unit comprises:
a second PMOS transistor including a first end coupled to the first node, a second end coupled to the second node, and a gate to which a ground voltage is input, the first end facing the second end,
wherein the second connection section comprises:
a second NMOS transistor including a gate to which the input voltage of the input node is input, and
wherein the internal node driving section comprises:
a third NMOS transistor including a first end coupled to the third node, a second end to which the back-bias voltage is applied, and a gate to which the output voltage of the output node is input, the first end facing the second end.

11. The level shifting circuit of claim 3, wherein the first level is a ground voltage level, the third level is a power supply voltage level, and the second level is a boosting voltage level higher than the power supply voltage level.

12. The level shifting circuit of claim 11, wherein the first output driving unit comprises:
a first NMOS transistor including a first end to which a ground voltage is applied, a second end coupled to the output node, and a gate to which the first voltage of the first node is input, the first end facing the second end,
wherein the second output driving unit comprises:
a first PMOS transistor including a first end to which a boosting voltage is applied, a second end coupled to the output node, and a gate to which the second voltage of the second node is input, the first end facing the second end,
wherein the first connection unit comprises:
a second NMOS transistor including a first end coupled to the first node, a second end coupled to the second node, and a gate to which a power supply voltage is input, the first end facing the second end,
wherein the second connection section comprises:
a second PMOS transistor including a gate to which the input voltage of the input node is input, and
wherein the internal node driving section comprises:
a third PMOS transistor including a first end coupled to the third node, a second end to which the boosting voltage is applied, and a gate to which the output voltage of the output node is input, the first end facing the second end.

13. A level shifting circuit comprising:
an inverter configured to invert an input voltage of an input node and drive a first voltage of a first node;
a first connection unit configured to electrically couple the first node to a second node or electrically isolate the first node from the second node in response to the first voltage of the first node;
a first output driving unit configured to drive an output voltage of an output node to a first level in response to a second voltage of the second node;
a first internal driving unit configured to drive the second voltage of the second node to the first level in response to the input voltage of the input node and the output voltage of the output node;
a second connection unit configured to electrically couple the first node to a third node or electrically isolate the first node from the third node in response to the first voltage of the first node;
a second output driving unit configured to drive the output voltage of the output node to a second level in response to a third voltage of the third node; and
a second internal driving unit configured to drive the third voltage of the third node to the second level in response to the input voltage of the input node and the output voltage of the output node.

14. The level shifting circuit of claim 13, wherein the input voltage of the input node swings between a third level lower than the first level and a fourth level higher than the second level, and the input voltage of the third or fourth level is inverted to be outputted as an inverted voltage of the fourth or third level.

15. The level shifting circuit of claim 14, wherein the first connection unit is configured to electrically couple the first node to the second node, when the first voltage of the first node is at the fourth level, and electrically isolates the first node from the second node when the first voltage of the first node is at the third level.

16. The level shifting circuit of claim 14, wherein the second connection unit is configured to electrically couple to the first node to the third node, when the first voltage of the first node is at the third level, and electrically isolates the first node from the third node when the first voltage of the first node is at the fourth level.

17. The level shifting circuit of claim 14, wherein the first internal driving unit comprises:
a third connection section including a first end coupled to the second node and a second end coupled to a fourth node and configured to electrically couple the second node to the fourth node or electrically isolate the second node from the fourth node in response to the input voltage of the input node, the first end facing the second end; and a first internal node driving section including one end coupled to the fourth node and configured to drive a fourth voltage of the fourth node to the first level when the output voltage of the output node is at the second level.

18. The level shifting circuit of claim 14, wherein the second internal driving unit comprises:

a fourth connection section including a first end coupled to the third node and a second end coupled to a fifth node and configured to electrically couple the third node to the fifth node or electrically isolate the third node from the fifth node in response to the input voltage of the input node, the first end facing the second end; and a second internal node driving section including one end coupled to the fifth node and configured to drive a fifth voltage of the fifth node to the second level when the output voltage of the output node is at the first level.

19. The level shifting circuit of claim 14, wherein the third level is a power supply voltage level, the fourth level is a ground voltage level, the first level is a boosting voltage level higher than the power supply voltage level, and the second level is a back-bias voltage level lower than the ground voltage level.

20. A semiconductor device comprising:

an inverter configured to invert an input voltage of an input node and drive a first voltage of a first node;

a first driving unit configured to transfer the first voltage of the first node to a second node in response to the first voltage of the first node, or drive a second voltage of the second node to a first level in response to the input voltage of the input node and an output voltage of an output node, wherein the first driving unit is directly coupled to both of the input node and the output node; and a second driving unit configured to drive the output voltage of the output node to a second level in response to the first voltage of the first node and drive the output voltage of the output node to the first level in response to the second voltage of the second node.

21. The semiconductor device of claim 20, wherein the input voltage swings between the second level and a third level and the input voltage of the second or third level is inverted to be outputted as an inverted voltage of the third or second level.

22. The semiconductor device of claim 21, wherein the first driving unit comprises:

a first connection section configured to electrically couple the first node to the second node or electrically isolate the first node from the second node in response to the first voltage of the first node;

a second connection section including a first end coupled to the second node and a second end coupled to a third node and configured to electrically couple the second node to the third node or electrically isolate the second node from the third node in response to the input voltage of the input node; and an internal node driving section including one end coupled to the third node and configured to drive a third voltage of the third node to the first level when the output voltage of the output node is at the second level.

23. The semiconductor device of claim 22, wherein the second level is a power supply voltage level, the third level is a ground voltage level, and the first level is a back-bias voltage level lower than the ground voltage level.

24. The semiconductor device of claim 23, wherein the second level is the ground voltage level, the third level is the power supply voltage level, and the first level is a boosting voltage level higher than the power supply voltage level.

* * * * *